United States Patent
Sekiya

(10) Patent No.: US 6,774,575 B2
(45) Date of Patent: Aug. 10, 2004

(54) ORGANIC ELECTROLUMINESCENCE DISPLAY

(75) Inventor: Mitsunobu Sekiya, Tokyo (JP)

(73) Assignee: Sony Corporation, Tokyo (JP)

( * ) Notice: Subject to any disclaimer, the term of this patent is extended or adjusted under 35 U.S.C. 154(b) by 84 days.

(21) Appl. No.: 09/914,050

(22) PCT Filed: Dec. 21, 2000

(86) PCT No.: PCT/JP00/09105
§ 371 (c)(1),
(2), (4) Date: Jan. 31, 2002

(87) PCT Pub. No.: WO01/47322
PCT Pub. Date: Jun. 28, 2001

(65) Prior Publication Data
US 2002/0167267 A1 Nov. 14, 2002

(30) Foreign Application Priority Data
Dec. 22, 1999 (JP) ............................. 11-363990

(51) Int. Cl.[7] .............................................. G09G 3/10
(52) U.S. Cl. .................... 315/169.3; 313/504; 313/505
(58) Field of Search ............................. 315/169.3, 167; 313/504, 502, 483, 498, 505, 506; 345/76

(56) References Cited

U.S. PATENT DOCUMENTS 5,612,549 A    3/1997  Nelson et al. ................. 257/88
6,429,599 B1 * 8/2002  Yokoyama ................ 315/169.3

FOREIGN PATENT DOCUMENTS

EP    0675 541    10/1995
JP    7-281618    10/1995
JP    9-106887    4/1997

* cited by examiner

Primary Examiner—James Clinger
Assistant Examiner—Thuy Vinh Tran
(74) Attorney, Agent, or Firm—Sonnenschein, Nath & Rosenthal LLP

(57) ABSTRACT

An organic electroluminescence display in which plural rows of scanning lines and plural columns of signal lines are arranged, and pixels are arranged at the portions where said scanning lines intersect said signal lines The pixels have an organic electroluminescence layer inclusive of an organic light-emitting layer held between first pixel electrodes constituted by said scanning lines and second pixel electrodes connected to said signal lines The second pixel electrodes are arranged so that the second pixel electrodes are overlapped on said scanning lines in a direction in which said signal lines are extending and each of said second pixel electrodes overlap at least two neighboring signal lines.

7 Claims, 5 Drawing Sheets

ORGANIC ELECTROLUMINESCENCE DISPLAY

BACKGROUND OF THE INVENTION

The present invention relates to an organic electroluminescence display and, particularly, to an organic electroluminescence display of a simple matrix type.

BACKGROUND ART

FIG. 6 schematically illustrates an organic electroluminescence (hereinafter abbreviated as EL) display of a simple matrix type. The organic EL display diagramed here has, arranged therein, plural rows (e.g., of a number n) of scanning lines L1, L2, . . . , Ln and plural columns (e.g., of a number of m) of signal lines S1, S2, . . . , Sm at right angles therewith. Pixels 10 including an organic EL layer that is not show are arranged at the portions where the scanning lines L1, L2, . . . , Ln and the signal lines S1, S2, . . . , Sm are overlapping one upon the other. Here, the organic EL layer includes at least an organic light-emitting layer. The number of pixels in this organic EL display is n×m.

In the thus constituted organic EL display, the lines are successively driven; i.e., the scanning lines L1, L2, . . . , Ln are successively selected with the passage of time, and light is emitted from only those pixels 10 on the selected scanning lines L1, L2, . . . , Ln.

It is therefore an object of the present invention to provide an organic EL display which makes it possible to improve the resolution without changing either the maximum light-emitting brightness of the organic light-emitting layer or the maximum brightness required for displaying the picture.

Therefore, though not diagramed here, there has been proposed an organic EL display of a constitution in which the signal lines are divided in a direction in which they are extending (e.g., divided into two) and are separately taken out. In the organic EL display of this constitution, the scanning lines corresponding to the divided signal lines are simultaneously selected (e.g., two scanning lines are simultaneously selected when the signal line is divided into two), in order to increase a maximum number N of the scanning lines (e.g., to double the number when the signal line is divided into two) and to improve the resolution.

In the organic EL display of the above-mentioned constitution, however, it becomes difficult to take out the signal lines to the external electrodes if the signal lines are divided into three or more (i.e., it becomes difficult to connect the intermediate signal lines that are divided to the drive circuit). Therefore, limitation is imposed on increasing a maximum number of the scanning lines by dividing the signal lines, and it becomes difficult to further improve the resolution of the organic EL display and to further increase the size of the screen by increasing the number of the scanning lines while maintaining the same pitch among the pixels.

SUMMARY OF THE INVENTION

It is therefore an object of the present invention to provide an organic EL display which makes it possible to improve the resolution without changing either the maximum light-emitting brightness of the organic light-emitting layer or the maximum brightness required for displaying the picture.

The present invention is concerned with an organic electroluminescence display in which plural rows of scanning lines and plural columns of signal lines are arranged, and pixels are arranged at portions where said scanning lines intersect said signal lines, said pixels having an organic electroluminescence layer inclusive of an organic light-emitting layer held between first pixel electrodes constituted by said scanning lines and second pixel electrodes connected to said signal lines, wherein said second pixel electrodes are overlapped on said scanning lines in a direction in which said signal lines are extending.

The second pixel electrodes can be arranged over plural neighboring signal lines.

According to this constitution, each scanning line is shared by plural pixels in a direction in which the scanning lines are arranged, and plural rows of pixel strings are arranged for a row (each) of the scanning lines. This decreases the number of the scanning lines on the display having the same pixel arrangement and, hence, increases the duty. As a result, it is allowed to increase a maximum number of the scanning lines without changing either the maximum light-emitting brightness of the organic light-emitting layer or the maximum brightness required for displaying the picture on the organic EL display. It is, therefore, allowed to improve the resolution and to increase the size of the screen.

According to the present invention, therefore, it is allowed to arrange the second pixel electrodes over the two neighboring scanning lines among the scanning lines arranged on the organic EL a display.

The second pixel electrodes arranged over the two scanning lines are shared by the two pixels arranged neighboring to each other in a direction in which the signal lines are extending. It is, therefore, allowed to decrease the number of the second pixel electrodes and to decrease the number of the portions where the pixels are connected to the signal lines, making it possible to increase the yield of the products.

According to the present invention, each of the signal lines can be divided into plural signal lines in the direction in which the signal lines extend on the organic electroluminescence display.

When each of the signal lines is divided into plural signal lines in the direction in which the signal lines extend, each of the scanning lines in each of the divided regions can be selected and displayed simultaneously, making it possible to further increase a maximum number of the scanning lines, to further improve the resolution and to increase the size of the screen.

DETAILED DESCRIPTION OF THE PRESENTLY PREFERRED EMBODIMENTS

Embodiments of the organic EL display according to the present invention will now be described in detail with reference to the drawings.

(First Embodiment)

Figure 1:
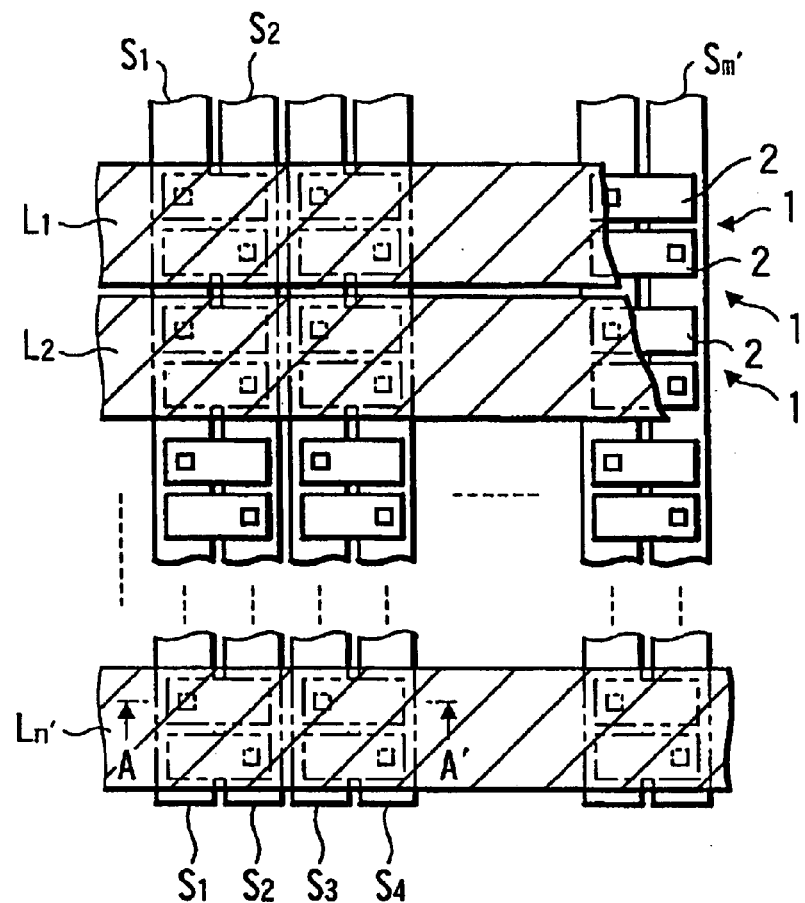
FIG. 1 is a diagram illustrating the constitution of an organic EL display according to a first embodiment of the present invention.
Figure 2:
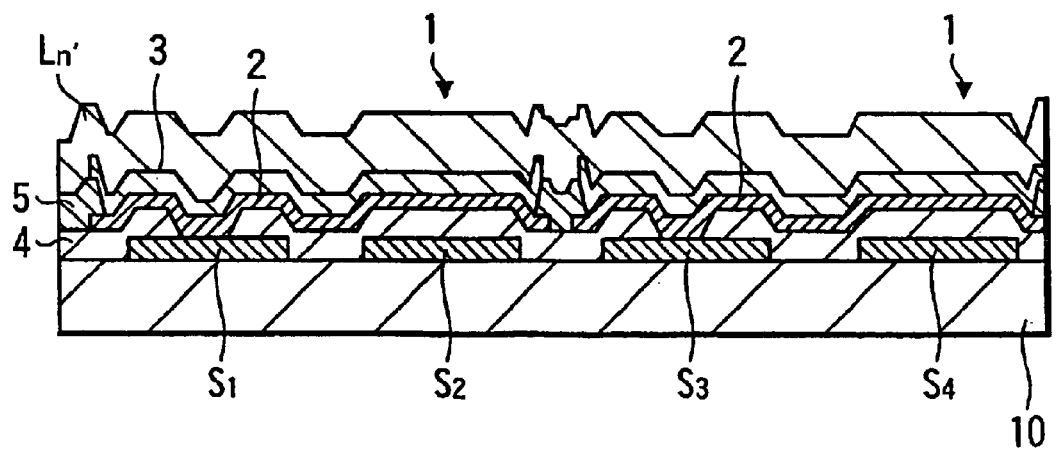
FIG. 2 is a sectional view along the line A–A' in FIG. 1 FIG. 3, FIG. 4 and FIG. 5.

FIG. 1 is a diagram illustrating the constitution of an organic EL display according to a first embodiment, and FIG. 2 is a sectional view across the line A–A' in FIG. 1. In the organic EL display that is shown, plural rows (of a number of n') of scanning lines L1, L2, ..., Ln' and plural columns (of a number of m') of signal lines S1, S2, ..., Sm' are arranged on a substrate 10 (shown in FIG. 2 only) in a manner to intersect each other. The scanning lines L1, L2, ..., Ln' are constituted by, for example, a transparent electrically conductive material, and the signal lines S1, S2, ..., Sm' are constituted by, for example, a metallic material. In the organic EL display, further, the scanning lines L1, L2, ..., Ln' are arranged being overlapped on the signal lines S1, S2, ..., Sm' that are arranged on the substrate 10 to thereby constitute a display which emits light from the side of the scanning line L1, L2, ..., Ln' opposite to the side of the substrate 10.

Pixels 1 are arranged at the portions where the scanning lines L1, L2, ..., Ln' intersect the signal lines S1, S2, ..., Sm'. Each pixel 1 comprises an organic EL element having an organic EL layer 3 (shown in FIG. 2 only) held between the scanning lines L1, L2, ..., Ln' (first pixel electrodes) which serve as the pixel electrodes and the second pixel electrodes 2 connected to the signal lines S1, S2, ..., Sm'.

Here, the second pixel electrodes 2 are formed, for example, of a metal and serve as positive electrodes of the organic EL elements. On the other hand, the first pixel electrodes constituted by the scanning lines L1, L2, ..., Ln' serve as negative electrodes of the organic EL elements. The organic EL layer 3 held between these electrodes comprises, for example, an organic electron transporting layer, an organic light-emitting layer and an organic positive hole transporting layer that are successively laminated from the side of the negative electrode. Further, the signal lines S1, S2, ..., Sm' are isolated from the second pixel electrodes 2 by an insulating film 4 (shown in FIG. 2 only) except the connection portions. Further, in order to accomplish the insulation between the second pixel electrodes 2 and the scanning lines L1, L2, ..., Ln; the peripheries of the second pixel electrodes 2 are covered with an insulating film 5 (shown in FIG. 2 only), and upper portions of the second pixel electrodes 2 exposed through the insulating film 5 are completely covered with the organic EL layer 3.

In this organic EL display, in particular, two second pixel electrodes 2 are overlapped on the scanning lines L1, L2, ..., Ln' in a direction in which the signal lines S1, S2 ..., Sm' are extending. The two second pixel electrodes 2 are overlapped over the two neighboring signal lines (S1, S2), (S3, S4), ..., Sm' and are respectively-connected to different signal lines S1, S2, ... Sm'.

Therefore, the pixels 1 are arranged in the same manner as the second pixel electrodes 2 which are thus arranged. In the direction in which the scanning lines L1, L2, ..., Ln' are arranged (in the direction in which the signal lines S1, S2, ..., Sm' are extending), pixels 1 are arranged in a number twice as large as the number (n') of the scanning lines L1, L2, ..., Ln' i.e., in a number of 2×n'. In the direction in which the signal lines S1, S2, ..., Sm' are arranged (in the direction in which the scanning lines L1, L2, ..., Ln' are extending), pixels 1 are arranged in a number one-half the number (m') of the signal lines S1, S2, ..., Sm' i.e., in a number of m'/2.

In the thus constituted organic EL display, when one of the scanning lines L1, L2, ..., Ln' is selected, signals from different signal lines S1, S2, ..., Sm' are applied to the pixels 1 arranged on one of the scanning lines L1, L2, ..., Ln'. Therefore, the pixels 1 emit light at different brightnesses.

Further, each of the scanning lines L1, L2, ..., Ln' is shared by two pixels 1 in the direction in which the signal lines S1, S2, ..., Sm' are extending. Therefore, two rows of pixel strings are arranged for a row (each) of the scanning lines L1, L2, ..., Ln'. This decreases the number of the scanning lines on the display having the same pixel arrangement. When, for example, it is attempted to realize the organic EL display of this embodiment having the pixel arrangement same as that of the organic EL display of the conventional structure having scanning lines in a number of n, signal lines in a number of m and pixels in a number of n×m, then, the number n' of the scanning lines L1, L2, ..., Ln', becomes n'=n/2, and the number m' of the signal lines S1, S2, ..., Sm' becomes m'=2×m.

Compared to the organic EL display of the conventional structure having pixels in a number of n×m, the number of the scanning lines L1, L2, ..., Ln' can be decreased to one-half. Therefore, the organic EL display possesses the duty which is twice as large as the duty of the conventional organic EL display.

As a result, a maximum number N of the scanning lines (corresponds to the number of rows in the pixel arrangement) described in the prior art can be doubled to improve a maximum resolution as compared with the organic EL display of the conventional structure having the same maximum light-emitting brightness B1 of the organic light-emitting layer and having the same maximum brightness B2 required for displaying the picture (having the same required duty). When the pitch among the pixels remains the same, the size of the screen of the organic EL display can be increased.

The organic EL display has a constitution in which the scanning lines L1, L2, ..., Ln' made of a transparent electrically conductive material are formed on the organic EL layer 3 thereby to constitute the organic EL display in which light emitted by the organic EL layer 3 passes only through the scanning lines L1, L2, ..., Ln' constituted by the transparent electrically conductive material to go out from the side opposite to the substrate 10. Therefore, the emitted light passes through a decreased number of the layers compared to the organic EL display of a transmission type in which light emitted by the organic EL layer 3 passes through the second pixel electrode 2, insulating film 4, signal lines S1, S2, ..., Sm' and substrate 10 to go out from the side of the substrate 10. This makes it possible to highly maintain the intensity (i.e., brightness) of light that is emitted. This constitution, further, makes it possible to form fine signal lines S1, S2, ..., Sm' using a metal material having excellent electrically conducting property.

(Second Embodiment)

Figure 3:
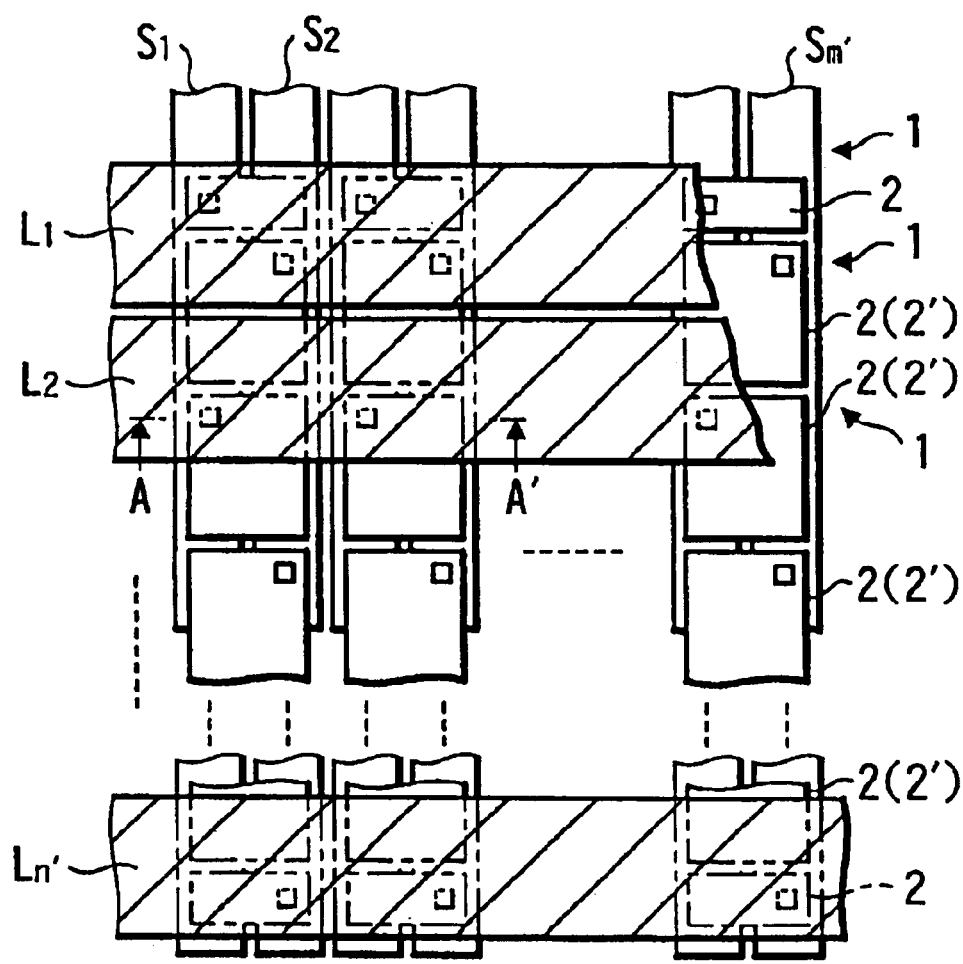
FIG. 3 is a view illustrating the constitution of the organic EL display according to a second embodiment of the present invention.

FIG. 3 is a diagram illustrating the constitution of the organic EL display according to a second embodiment. Described below is the constitution of the organic EL display of the second embodiment based on FIG. 3 and FIG. 2 used for the description of the first embodiment. FIG. 2 is a sectional view along the line A–A' in FIG. 3.

The organic EL display shown in these drawings is different from the organic EL display of the first embodiment in regard to the arrangement of the second pixel electrodes 2 connected to the signal lines S1, S2, ..., Sm'. In other respects, the organic EL display is the same as the organic EL display of the first embodiment.

That is, in the organic EL display shown in these drawings, the second pixel electrodes 2(2') are arranged over the two scanning lines (L1, L2), (L2, L3), ..., (Ln'–1, Ln') which are arranged neighboring each other among plural scanning lines L1, L2, ..., Ln' in the organic El display of the first embodiment. Therefore, the second pixel electrode 2 (2') overlapped over the two scanning lines L1, L2, ..., Ln' constitute two pixels 1 that are driven by different scanning lines L1, L2, ..., Ln'. Further, the second pixel electrodes 2 (2') sharing the same scanning line L1, L2, ..., Ln' for constituting the pixels 1, are connected to the different signal lines S1, S2, ..., Sm'.

Here, the organic EL layer 3 held between the scanning lines L1, L2, ..., Ln' and the second pixel electrodes 2 (2') may be separated for each of the pixels 1 or may be provided for each of the second pixel electrodes 2 (2').

In the thus constituted organic EL display, the second pixel electrode 2 (2') is overlapped over the two scanning lines (L1, L2), (L2, L3), ..., (Ln'–1, Ln') and is, hence, shared by the two pixels 1 arranged neighboring each other in the direction in which the signal lines S1, S2, ..., Sm' extends. It is, therefore, allowed to decrease the number of the second pixel electrodes 2 and to decrease the number of the portions where the pixels 1 are connected to the signal lines S1, S2, ..., Sm' (i.e., the number of the portions where the second pixel electrodes 2 are connected to the signal lines S1, S2, ..., Sm'.

Further, like the organic EL display of the first embodiment, each of the scanning lines L1, L2, ..., Ln' is shared by the two pixels 1 in the direction in which the signal lines S1, S2, ..., Sm' extend, and two rows of pixel strings are arranged for a row (each) of the scanning lines L1, L2, ..., Ln'. Like in the first embodiment, therefore, a maximum number N of the scanning lines described in the prior art can be doubled making it possible to improve a maximum resolution in the organic EL display and to increase the size of the screen.

The first and second embodiments have dealt with the cases where each of the scanning lines L1, L2, ..., Sm' is shared by two pixels 1 in the direction in which the signal lines S1, S2, ..., Sm' are extending. In the organic EL display of the present invention, however, each of the scanning lines L1, L2, ..., Ln' may be shared by a plurality of three or more pixels in the direction in which the signal lines S1, S2, ..., Sm' are extending, and the second pixel electrodes 2 may be connected to the different signal lines S1, S2, ..., Sm'. In this case, a plurality of three or more rows of pixel strings are arranged for a row (each) of the scanning lines L1, L2, ..., Ln' making it possible to further increase the maximum number of the scanning lines N. Here, in the second embodiment, when each of the scanning lines L1, L2, ..., Ln' is shared by three or more plural pixels, the second pixel electrodes (2(2') in FIG. 3.) at both ends are so arranged as to be overlapped on the neighboring scanning lines among the second pixel electrodes arranged in the direction in which the signal lines S1, S2, ..., Sm' are extending.

(Third Embodiment)

Figure 4:
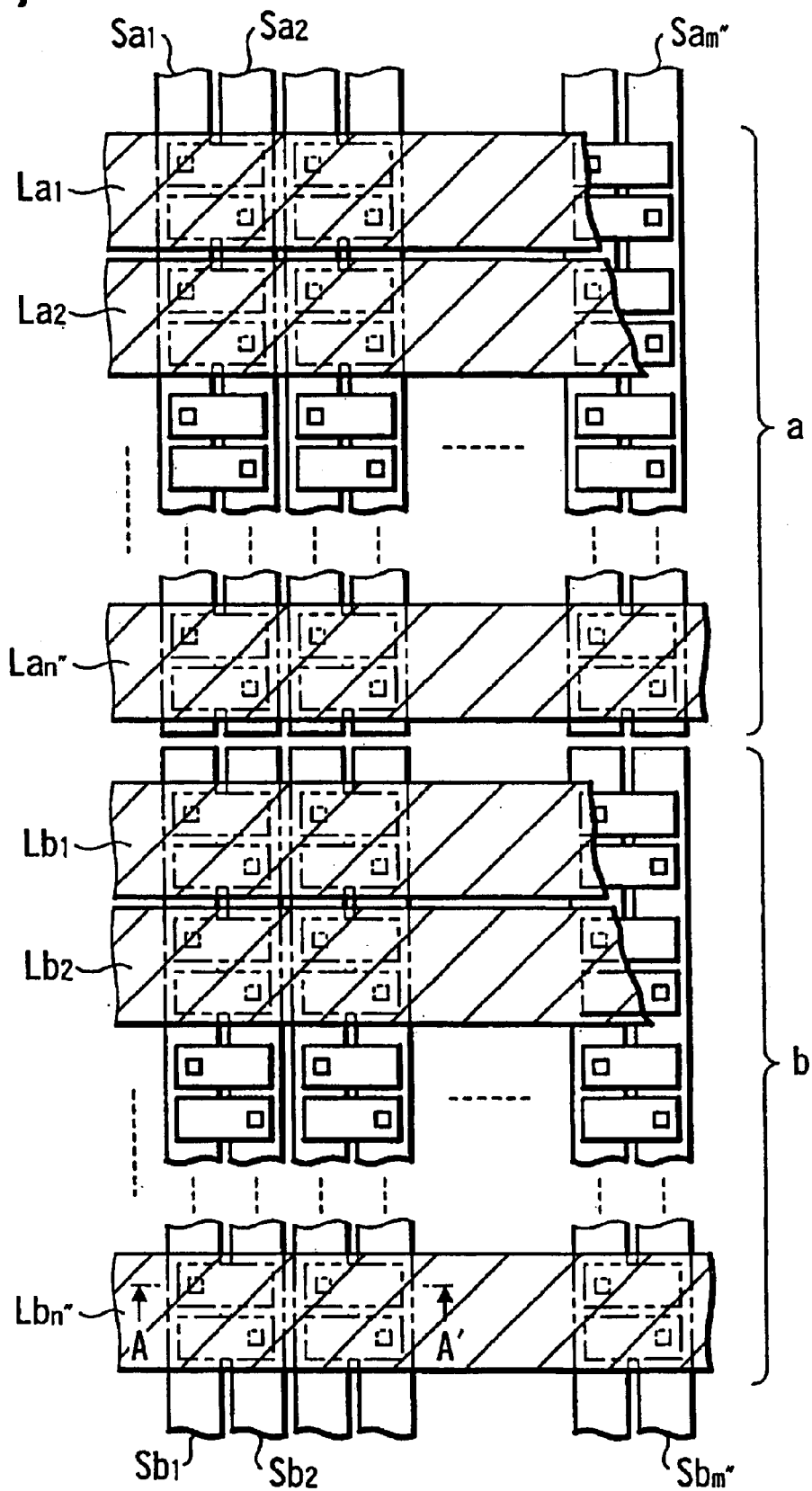
FIG. 4 is a view illustrating the constitution of the organic EL display according to a third embodiment of the present invention.

FIG. 4 is a diagram illustrating the constitution of the organic EL display according to a third embodiment. Described below is the constitution of the organic EL display of the third embodiment based on FIG. 4 and FIG. 2 used for the description of the first embodiment. FIG. 2 is a sectional view along the line A–A' in FIG. 4.

The organic EL display shown in these drawings is different from the organic EL display of the first embodiment in regard to the constitution of the signal lines. In other respects, the organic EL display is the same as the organic EL display of the first embodiment.

That is, in the organic EL display shown in these drawings, the signal lines (S1, S2, ..., Sm' in the organic EL display of the first embodiment are divided into plural numbers (divided into two, here) in the direction in which they extend. Concretely speaking, a pixel region in which the pixels are arranged is divided into two in the direction in which the signal lines extend, and plural signal lines Sa1, Sa2, ..., Sam' are arranged in the first region a, and plural signal lines Sb1, Sb2, ..., Sbm" are arranged in the second region b. Here, the number of the signal lines Sa1, Sa2, ..., Sam" is the same as the number of the signal lines Sb1, Sb2, ..., Sbm", i.e., m".

In the first region a, the scanning lines La1, La2, ..., Lan" are arranged to intersect the signal lines Sa1, Sa2, ..., Sam" and in the second region b, the scanning lines Lb1, Lb2, ..., Lbn" are arranged intersecting the signal lines Sb1, Sb2, ..., Sbm". The number of the scanning lines La2, La2, ..., Lan" is the same as the number of the scanning lines Lb1, Lb2, ..., Lbn", i.e., n". Independent drive circuits (not shown) are connected to the scanning lines Lb1, Lb2, ..., Lan" in the first region a and to the scanning lines Lb1, Lb2, ..., Lbn" in the second region b.

When, for example, it is attempted to realize the organic EL display of the third embodiment having the pixel arrangement same as that of the organic EL display of the first embodiment having scanning lines in a number of n', signal lines in a number of m' and pixels in a number of n'×m', then, the numbers n" of the scanning lines La1, La2, ..., Lan" and of the scanning lines Lb1, Lb2, ..., Lbn", becomes n"–n'/2, and the number m" of the signal lines Sa1, Sa2, ..., Sam" (Sb1, Sb2, ..., Sbm") becomes m"–m'.

In the thus constituted organic EL display, the signal lines are divided into two in the direction in which they are extended making it possible to simultaneously select and display each of the scanning lines in the first region a and in the second region b (e.g., La2 and Lb1, La2 and Lb2, ..., Lan" and Lbn").

Compared to the organic EL display of the first embodiment, therefore, this decreases into one-half the numbers n" of the scanning lines La2, La2, ..., Lan" and of the scanning lines Lb1, Lb2, ..., Lbn" that are driven independently of each other. It is, therefore, made possible to double the duty of the organic EL display compared to that of the organic EL display of the first embodiment.

Compared to the organic EL display of the first embodiment, therefore, the organic EL display of the third embodiment makes it possible to double a maximum number N of the scanning lines and, hence, to improve a maximum resolution by increasing the number of the scanning lines (corresponds to the number of rows in the pixel arrangement) and, further, to increase the size of the screen.

The third embodiment has dealt with the case where the signal lines are divided into two in the direction in which they are extending. In the organic EL display of the present invention, however, the number of dividing the signal lines is not limited to two only but may be three or more provided it is in a range where it is allowed to arrange the electrodes taken out from the divided signal lines. When the signal lines are divided into three or more, a maximum number N of the scanning lines can be increased to three or more times as large as that of the organic EL display of the first embodiment.

The third embodiment has dealt with the constitution in which the signal lines are divided into two in the direction in which they extend on the organic EL display of the first embodiment. However, the organic EL display of the present invention may be the one of the constitution in which the signal lines are divided into two (or into three or more) in the direction in which they extend on the organic EL display of the second embodiment. This constitution will be described as a fourth embodiment.

(Fourth Embodiment)

Figure 5:
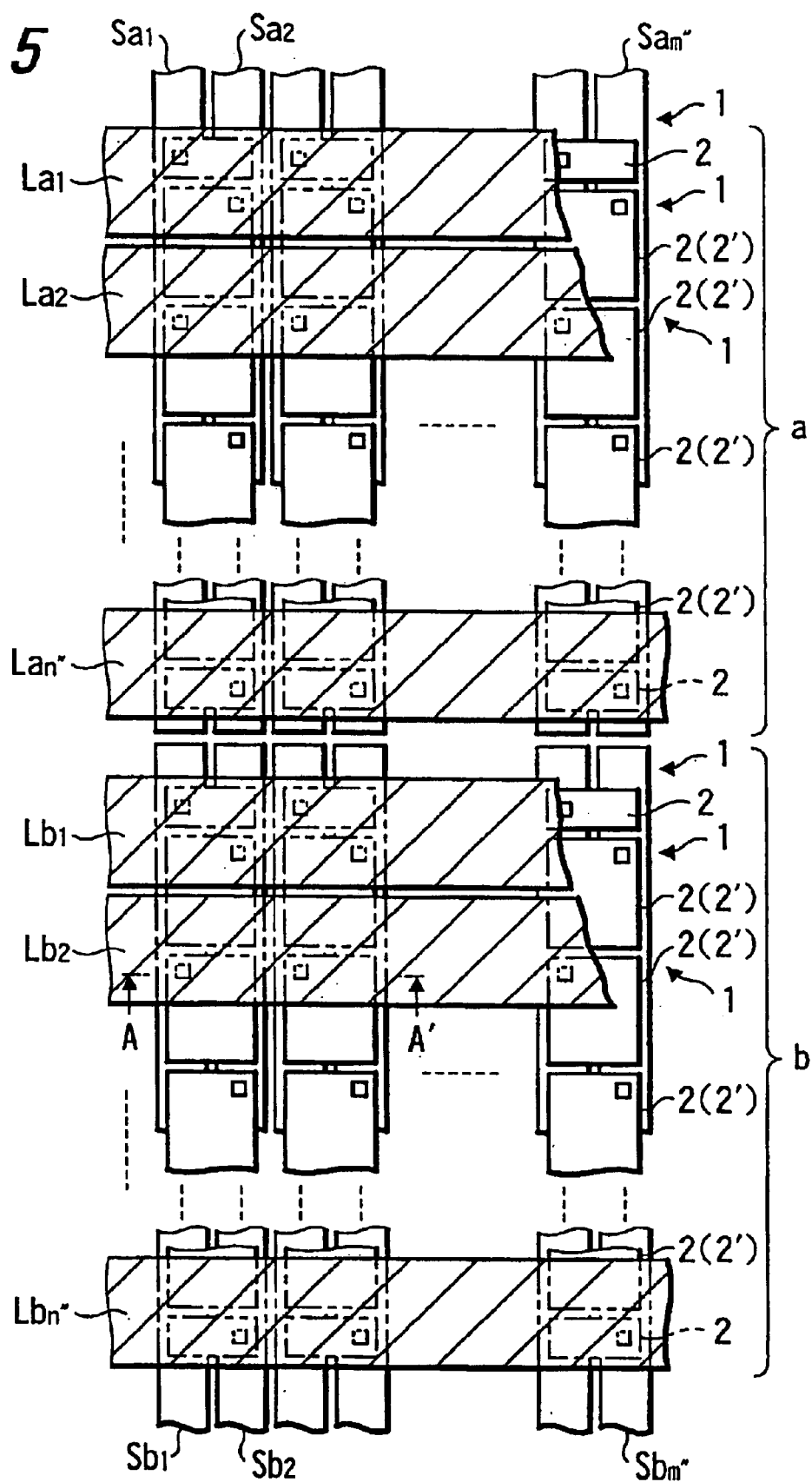
FIG. 5 is a view illustrating the constitution of the organic EL display according to a fourth embodiment of the present invention.
Figure 6:
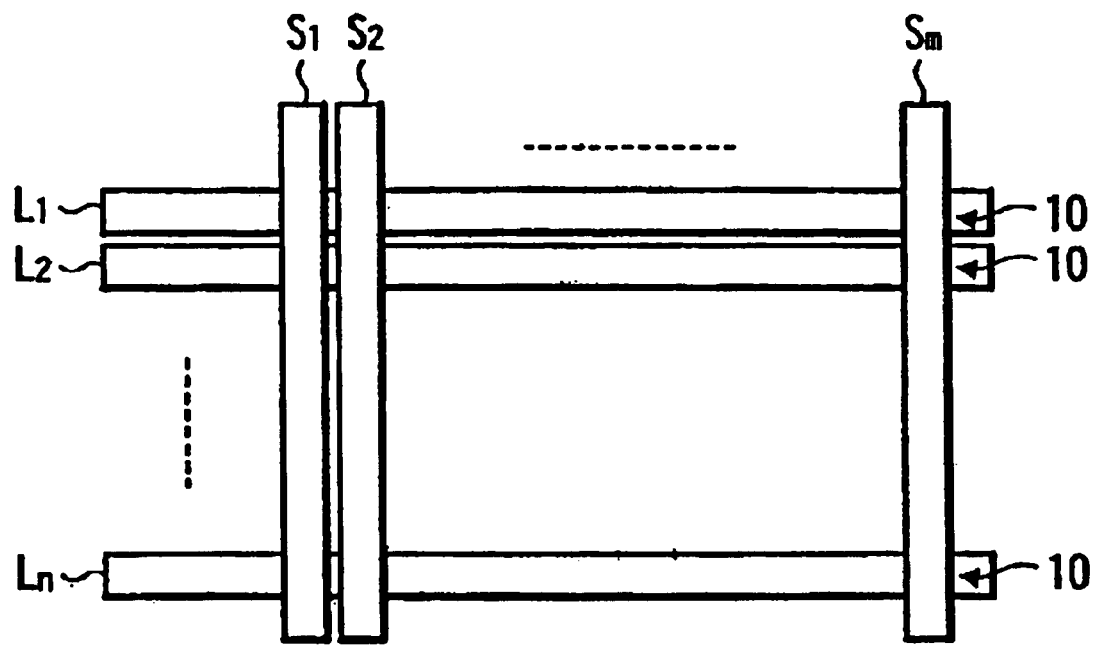
FIG. 6 is a view illustrating the constitution of a conventional organic display.

FIG. 5 is a view illustrating the constitution of an organic EL display according to a fourth embodiment. Described below is the constitution of the organic EL display of the fourth embodiment based on FIG. 5 and FIG. 2 used for the description of the first embodiment. FIG. 2 is a sectional view along the line A–A' in FIG. 5.

The organic EL display shown in these drawings is different from the organic EL display of the third embodiment in regard to changing the arrangement of the second pixel electrodes to the arrangement of the second pixel electrodes of the second embodiment. In other respects, the organic EL display is the same as the organic EL display of the third embodiment.

That is, in the organic EL display shown here, the second pixel electrodes 2 are arranged over the neighboring two scanning lines (La2, La2), (La2, La3), . . . , (Lan"–1, Lan") among the plural scanning lines La1, La2, . . . , (Lan"–1, Lan") in the first region a of the organic EL display of the third embodiment. Similarly, the second pixel electrodes 2 are arranged over the two neighboring scanning lines (Lb1, Lb2), (Lb2, Lb3), . . . , Lbn"–1, Lbn") among the plural scanning lines Lb1, Lb2, . . . , (Lbn"–1, Lbn") in the second region b. Accordingly, the second electrodes 2 (2') overlapped over the two scanning lines (La1, La2), (La2, La3), . . . , (Lan"–1, Lan") (Lb1, Lb2), (Lb2, (Lb3), . . . , (Lbn"–1, Lbn") constitute two pixels 1 that are driven by different scanning lines La1, La2, . . . , Lan", Lb1, Lb2, . . . , Lbn". Further, the second pixel electrodes 2 (2') sharing the same scanning line La1, La2, . . . , Lan", Lb1, Lb2, . . . , Lbn" to constitute the pixels 1, are connected to the different signal lines Sa1, Sa2, . . . , San", Sb1, Sb2, . . . , Sbn". That is, the arrangement of the second electrodes in the above-mentioned second embodiment.

In the thus constituted organic EL display, the signal lines are divided into two in the direction in which they extend, and each second pixel electrodes overlaps two neighboring scanning lines to exhibit the effects of the second embodiment as well as the effect of the third embodiment. That is, the number of the second pixel electrodes and the number of the places where the pixels are connected to the signal lines (places where the second pixel electrodes are connected to the signal lines) can be decreased and, besides, the maximum number N of the scanning lines can be doubled as compared with the organic EL display of the first embodiment. An increase in the number of the scanning lines (corresponds to the number of rows of pixel strings) makes it possible to improvise a maximum resolution and to increase the size of the screen.

Further, the above-mentioned first to fourth embodiments have dealt with the cases where the invention was applied to the organic EL display of the upper-surface-light-emitting type in which the scanning lines L1, L2, . . . , Ln' are constituted by a transparent electrically conductive material, and light emitted from the organic EL layer 3 is allowed to go out from the side of the scanning lines L1, L2, . . . , Ln'. However, the invention can also be applied to an organic EL display of the transmission type in which the emitted light goes out from the side of the substrate 10. In this case, however, at least the second pixel electrodes 2, insulating film 4, and substrate 10 are formed of transparent materials. The invention can be, further, applied to an organic EL display of a constitution in which the scanning lines L1, L2, . . . , Ln' are arranged on the substrate 10, and the second pixel electrodes 2 and signal lines S1, S2, . . . , Sm' are arranged thereon via an organic EL layer 3. Here, however, the materials of the layers are suitably selected by taking into consideration the direction in which the emitted light goes out and, besides, the structure of the organic EL layer is suitably selected by taking into consideration the materials of the selected scanning lines L1, L2, . . . Ln' and of the second pixel electrodes 2.

According to the organic EL display of the present invention as described above, each scanning line is shared by plural pixels in the direction in which the signal lines extend enabling plural rows of pixel strings to be arranged for a row (each) of the scanning lines L1, L2, . . . , Ln', making it possible to decrease the number of the scanning lines on the display having the same number of pixels and to increase the duty. As a result, it is allowed to increase a maximum number of scanning lines of the organic EL display, to improve the resolution and to increase the size of the screen without changing either the maximum light-emitting brightness of the organic light-emitting layer or the maximum brightness required for displaying the picture on the organic EL display.

DESCRIPTION OF REFERENCE NUMERALS

1 - - - pixels
2, 2' - - - second pixel electrodes
3 - - - organic EL layer
L1, L2, - - - , Ln', - - - scanning lines (first pixel electrodes)
La1, La2, - - - , Lan", - - - scanning lines (first pixel electrodes)
Lb1, Lb2, - - - , Lbn", - - - scanning lines (first pixel electrodes)
S1, S2, - - - , Sm', - - - signal lines
Sa1, Sa2, - - - , Sam" - - - signal lines
Sb1, Sb2, - - - , Sbm" - - - signal lines
4 - - - insulating film
5 - - - insulating film
10 - - - substrate

What is claimed is:

1. An organic electroluminescence display in which plural rows of scanning lines and plural columns of signal lines are arranged, and pixels are arranged at portions where said scanning lines intersect said signal lines, said pixels having an organic electroluminescence layer inclusive of an organic light emitting layer held between first pixel electrodes constituted by said scanning lines and second pixel electrodes connected to said signal lines, wherein said second pixel electrodes are overlapped on said scanning lines in a direction in which said scanning lines are extending and each of said second pixel electrodes is arranged over at least two neighboring signal lines.

2. An organic electroluminescence display according to claim 1, wherein each of said second pixel electrodes is arranged over two neighboring scanning lines among said scanning lines.

3. An organic electroluminescence display according to claim 2, wherein said signal lines are divided into plural lines in a direction in which they extend.

4. An organic electroluminescence display according to claim 1, wherein atleast one of said second pixel electrodes is arranged over two neighboring scanning lines among said scanning lines.

5. An organic electroluminescence display according to claim 4, wherein said signal lines are divided into plural lines in a direction in which they extend.

6. An organic electroluminescence display according to claim 1, wherein each of said second pixel electrodes is connected to one of said at least two neighboring signal lines.

7. An organic electroluminescence display according to claim 1, wherein said signal lines are divided into plural lines in a direction in which they extend.

* * * * *